United States Patent [19]
Haji et al.

[11] Patent Number: 5,909,633
[45] Date of Patent: Jun. 1, 1999

[54] METHOD OF MANUFACTURING AN ELECTRONIC COMPONENT

[75] Inventors: Hiroshi Haji, Chikushino; Shoji Sakemi, Fukuoka, both of Japan

[73] Assignee: Matsushita Electric Industrial Co., Ltd., Osaka, Japan

[21] Appl. No.: 08/979,694

[22] Filed: Nov. 26, 1997

[30] Foreign Application Priority Data

Nov. 29, 1996 [JP] Japan ................................. 8-319105
Aug. 19, 1997 [JP] Japan ................................. 9-222196

[51] Int. Cl.⁶ ................................................. H01L 21/44
[52] U.S. Cl. ......................... 438/612; 438/106; 438/613
[58] Field of Search ............................... 438/612, 106, 438/613

[56] References Cited

U.S. PATENT DOCUMENTS 5,222,014  6/1993  Lin .
5,723,369  3/1998  Barber ..................................... 438/106
5,726,079  3/1998  Johnson ................................... 438/106
5,767,008  6/1998  Haji ........................................ 438/612

Primary Examiner—Kevin M. Picardat
Assistant Examiner—Deven Collins
Attorney, Agent, or Firm—McDermott, Will & Emery

[57] ABSTRACT

Nickel films 22, 25 are formed on copper pads 21, 24 on a substrate 11, and gold layers 23, 26 are further formed on the nickel films 22, 25. To suppress formation of compound of gold and tin which spoils reliability of soldering, formation of gold layers 23, 26 on the nickel films 22, 25 is effected by very thin substitutional plating method. As a result, a solder bump 17 is formed favorably. Besides, an nickel oxide film 32 formed on the surface of the gold layer 23 is removed by plasma etching. As a result, bonding of wire 15 is also excellent.

14 Claims, 9 Drawing Sheets

METHOD OF MANUFACTURING AN ELECTRONIC COMPONENT

BACKGROUND OF THE INVENTION

The present invention relates to a method of manufacturing an electronic component.

As an assembly structure of an electronic component, it is known to bond a wire for connecting a substrate and a semiconductor element on an electrode on the surface of the substrate and to form a bump as a protruding electrode on other electrode. As such electronic component, a BGA (ball grid array) package is known. As the wire, a gold wire is used widely, and as the bump, a solder is used widely.

FIG. 17 is a sectional view of a conventional substrate. In the diagram, reference numeral 1 denotes a substrate such as glass epoxy substrate, and copper pads 2, 3 of circuit patterns are formed on its upper and lower surfaces. Nickel layers 4, 5 are formed on the copper pads 2, 3, and gold layers 6, 7 are formed on the nickel layers 4, 5. The upper side copper pad 2 and lower side copper pad 3 are connected by an internal wiring 8. On the gold layer 6 of one copper pad 2, the end of a gold wire 9 for connecting a semiconductor element (not shown) mounted on the substrate 1 is bonded, and a solder bump 10 is formed on the gold layer 7 of other copper pad 3, thereby assembling an electronic component.

The nickel layers 4, 5 and gold layers 6, 7 are generally formed by plating method. The gold layers 6, 7 are formed for enhancing bonding performance of the gold wire 9. Conventionally, the thickness of the gold layers 6, 7 was about 0.2 to 1 micron, and they were considerably thick. The nickel layers 4, 5 are formed as barrier metal for preventing the material copper of the copper pads 2, 3 from diffusing into the gold layers 6, 7.

In such conventional method, when plating with gold, the component nickel of nickel layers 4, 5 is melted into the plating solution, and the nickel mixes into gold plating layers. The nickel positioned on the surface of the gold layers 6, 7 forms a compound such as oxide and hydroxide by heating in the process of fixing the semiconductor element. This compound blocks bonding of gold wire 9. As the gold layer becomes thicker, an amount of nickel positioned on the surface is reduced, and in order not to form this oxide as far as possible, the thickness of the gold layers 6, 7 must be greater than a certain thickness.

However, if the gold layers 6, 7 are too thick, bonding force of solder bump 10 drops. This is because, when forming the solder bump 10, the gold in the gold layer 7 is melted into the solder bump 10 and is combined with tin in the solder to form a brittle compound. Thus, for the purpose of bonding of gold wire 9, one gold layer 6 is preferred to be thick, while the other gold layer 7 is preferred to be thin for forming and soldering the solder bump 10. It is hence difficult to solve these contradictory problems.

It may be also considered to apply gold plating only on the electrode for bonding the gold wire 9, but it requires a process of covering the non-plating electrode with a mask, and a process of removing this mask after plating, and the manufacturing cost is much increased.

It is hence an object of the invention to present a method of manufacturing an electronic component capable of bonding a gold wire favorably on an electrode on a substrate and soldering favorably.

SUMMARY OF THE INVENTION

An aspect of method of manufacturing an electronic component of the invention comprises a step of forming plural copper pads as electrodes on a surface of a substrate, a step of forming a barrier metal layer comprising a nickel layer, on the surface of each of the copper pads, a step of forming a gold layer by plating on the surface of the barrier metal layer, a step of mounting a semiconductor element on the substrate and fixing by heating with a thermosetting adhesive, a step of removing a nickel compound formed on the surface of the gold layer by heating by plasma etching, a step of molding resin for sealing the semiconductor element on the surface of the substrate, and a step of forming a solder portion on the gold layer not sealed with the resin.

According to this method of manufacturing an electronic component, the nickel compound on the surface of the gold layer that interferes bonding of gold wire are removed by plasma cleaning. Therefore, the gold layer may be extremely thin, and the gold wire can be favorably bonded, and the solder portion such as solder bump may be also formed favorably.

Other aspect of method of manufacturing an electronic component of the invention comprises a step of forming a copper pad as an electrode at each of plural positions on a surface of a substrate, a step of forming a barrier metal layer comprising a nickel layer, on the surface of the copper pad, a step of forming a gold layer of enough thickness for metal bonding performance on the surface of the barrier metal layer by plating, a step of mounting a semiconductor element on the substrate, a step of connecting the semiconductor element and the gold layer electrically, a step of sealing the semiconductor element with resin, a step of thinning the gold layer not sealed with the resin by plasma etching, and a step of forming a solder portion on the thinned gold layer.

According to this method of manufacturing an electronic component, a portion of the gold layer which interferes bonding performance of solder is removed by plasma cleaning, after forming the gold layer of enough thickness for metal bonding performance on the electrode on the substrate, and the gold layer is thinned. After that, the solder portion is formed on the thinned gold layer. Therefore, the gold layer and semiconductor element can be connected favorably by wire bonding, and melting of gold into the solder is arrested, so that a favorable solder portion may be formed.

DESCRIPTION OF THE PREFERRED EMBODIMENTS

First embodiment

Figure 1:
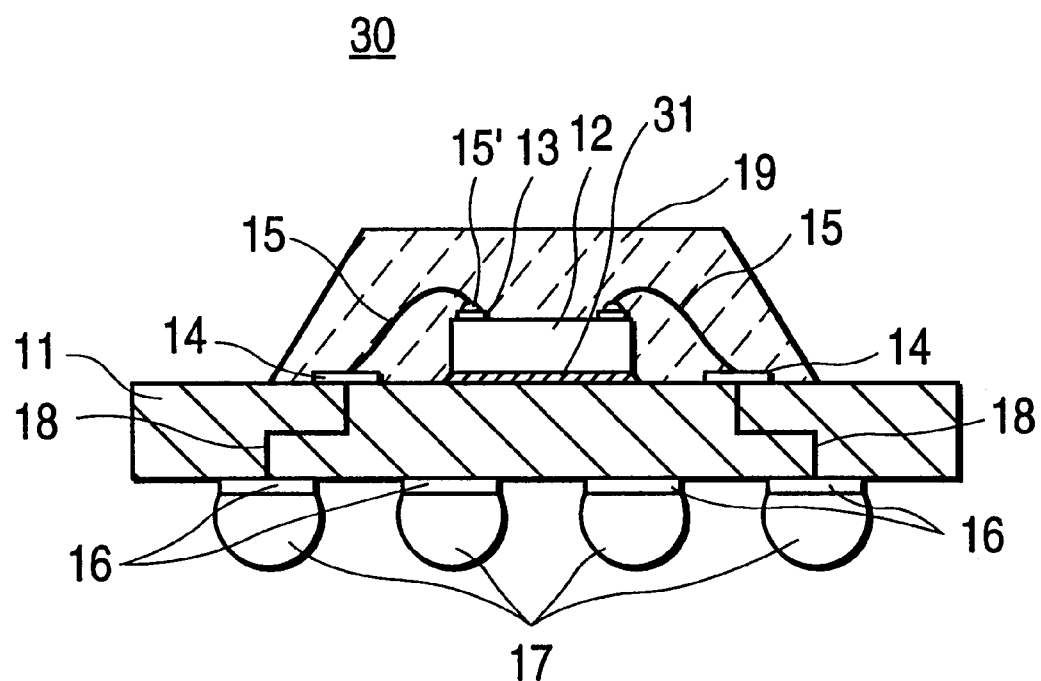
FIG. 1 is a sectional view showing a structure of an electronic component in a first embodiment of the invention.

First, the structure of an electronic component is described. In FIG. 1, on the top surface of a substrate 11, a semiconductor element 12 is bonded by a thermosetting adhesive 31. A pad 13 on the surface of the semiconductor element 12 and an electrode 14 on the top surface of the substrate are electrically connected through a gold wire 15. A gold ball 15' formed at the tip of the gold wire is bonded to the pad 13.

On the bottom surface of the substrate 11, an electrode 16 is formed. A solder bump 17 is formed on the electrode 16. The electrode 14 and electrode 16 are connected through an internal wiring 18. The top surface of the substrate 11 is molded with resin 19 for sealing the semiconductor element 12, electrode 14, and gold wire 15.

Figure 2:
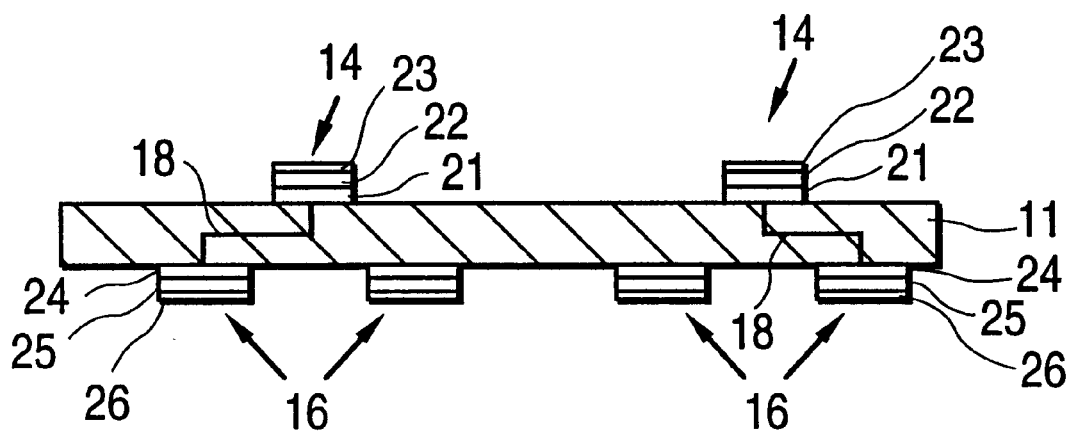
FIG. 2 through FIG. 8 are drawings for explaining the method of manufacturing an electronic component shown in FIG. 1, FIG. 2 being a sectional view of a substrate, FIG. 3 being a sectional view of the substrate on which a semiconductor element is fixed, FIG. 4 being a sectional view around the electrode after heat treatment, FIG. 5 being a sectional view of a plasma etching apparatus, FIG. 6 being a sectional view after wire bonding, FIG. 7 being a sectional view after molding a resin, and FIG. 8 being a sectional view after forming a solder bump.

Referring now to FIG. 2 through FIG. 8, a method of manufacturing an electronic component shown in FIG. 1 is described. FIG. 2 through FIG. 8 are shown in the sequence of the manufacturing process. FIG. 2 shows a sectional view of the substrate 11. The top side electrode 14 is formed by coating a copper pad 21 on the substrate 11, coating a nickel layer 22 as a barrier metal layer on the copper pad 21, and further coating a gold layer 23 thinly on the nickel layer 22. The bottom side electrode 16 is similarly formed by coating a copper pad 24, coating a nickel layer 25 on the copper pad 24, and further coating a gold layer 26 very thinly on the nickel layer 25. The gold layers 23, 26 are formed simultaneously by substitutional plating method, and the thickness is about 0.03 to 0.05 microns, being far thinner than in the prior art (0.2 to 1 micron as mentioned above). The top side gold layer 23 is formed for maintaining the bonding force of the gold wire.

Figure 3:
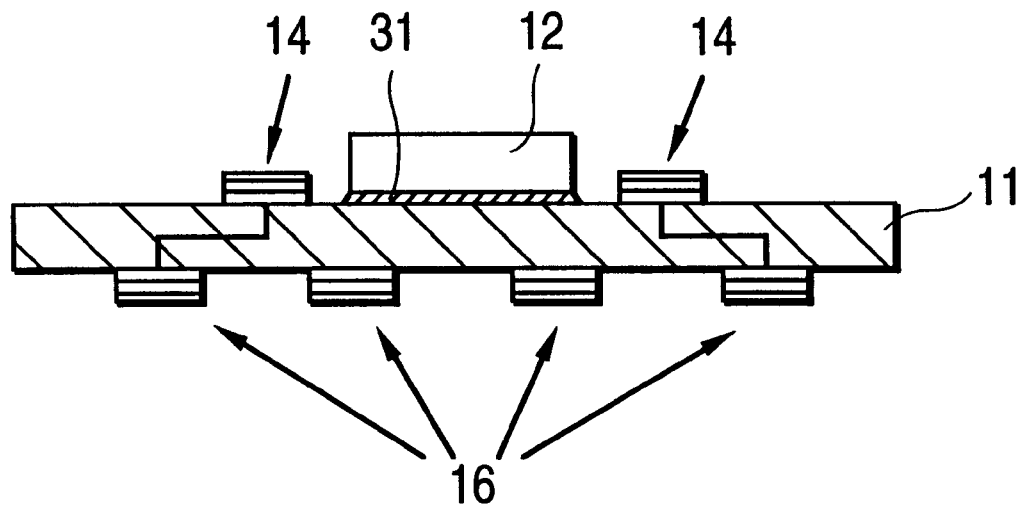

In FIG. 3, a semiconductor layer 12 is mounted on the top surface of the substrate 11, and is adhered by a thermosetting adhesive 31 applied preliminarily on the top surface of the substrate 11. The substrate 11 is then heated. As the thermosetting adhesive 31 is cured, the semiconductor element 12 is fixed on the substrate 11.

Figure 4:
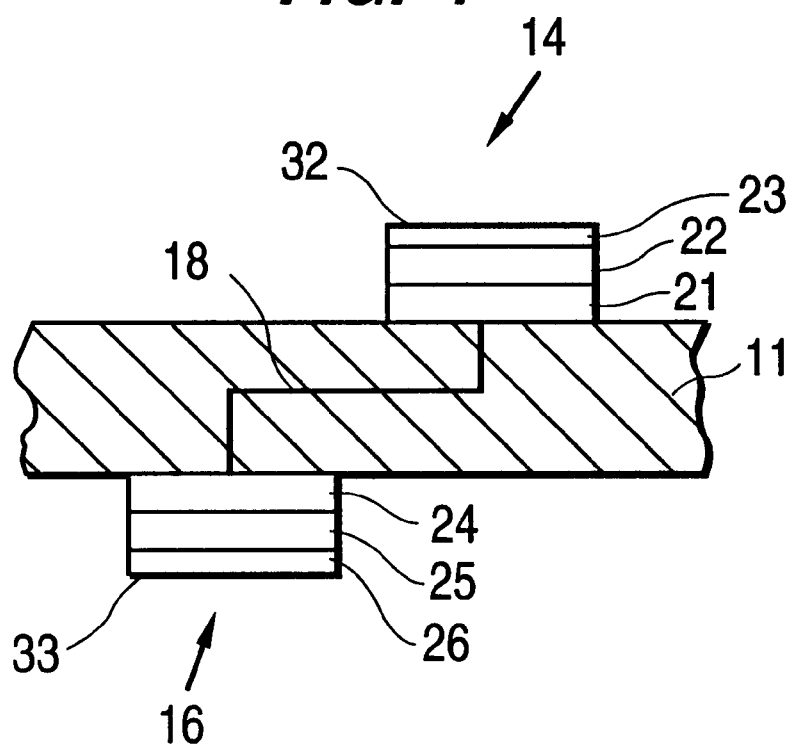

FIG. 4 is a sectional view near the electrodes 14, 16 on the substrate 11 after this heat treatment. Reference numerals 32 and 33 are nickel compounds such as nickel hydroxide and nickel oxide formed on the surface of the gold layers 23, 26 of the electrodes 14, 16. These nickel compounds 32, 33 are formed as a result of reaction of nickel mixing into the gold layers 23, 26 in the plating process, with oxygen or moisture on the surface of the gold layers 23, 26 in the process of heat treatment. As mentioned above, the nickel compound 32 formed at the top electrode 14 side interferes bonding performance of gold wire. On the other hand, the nickel compound 33 at the bottom electrode 16 side is reduced and removed by the flux applied in a later process, and hence has no adverse effect on the adhesion of the solder bump 17.

Figure 5:
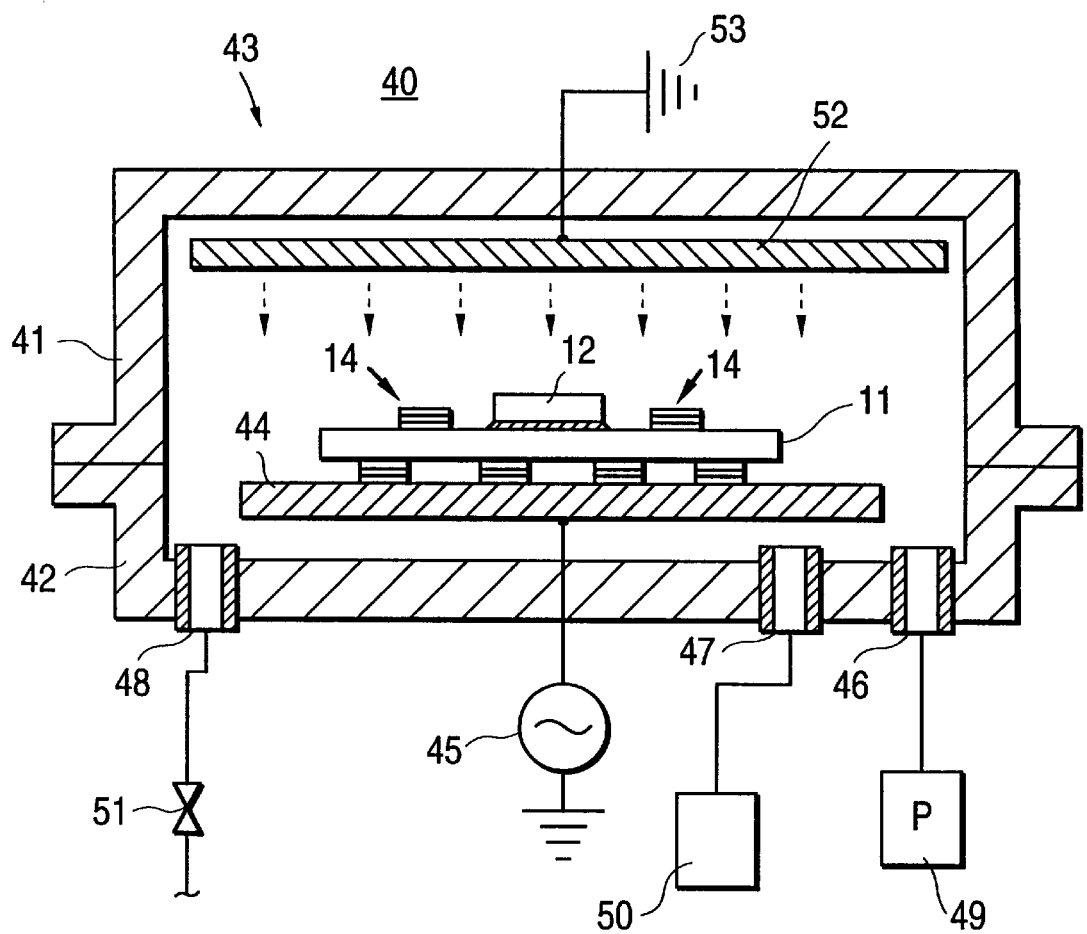

Consequently, to remove the nickel compound 32 at the electrode 14 side, plasma etching is carried out. Referring to FIG. 5, the structure of a plasma etching apparatus 40 used in this plasma etching is described below. In FIG. 5, an upper casing 41, together with a lower casing 42, forms a vacuum container 43 which is free to open and close. A high frequency electrode 44 is disposed in the bottom of the lower casing 42. A high frequency power supply 45 is connected to the high frequency electrode 44. Pipes 46, 47, 48 are provided in the bottom of the lower casing 42. A vacuum source 49 is connected to the pipe 46. A gas feed unit 50 for feeding plasma etching gas such as argon gas is connected to the pipe 47. A vacuum breakage valve 51 is connected to the pipe 48.

An earth electrode 52 is mounted on the top of the upper casing 41. The earth electrode 52 is grounded to a grounding unit 53, and is installed opposite to the high frequency electrode 44. The substrate 11 is mounted on the high frequency electrode 44.

The operation of this plasma etching apparatus 40 is described below. In FIG. 5, with the substrate 11 mounted on the high frequency electrode 44, the upper casing 41 is closed. Then, the vacuum source 49 begins to evacuate, and the inside of the vacuum container 43 reaches a specified degree of vacuum. Consequently, argon gas is supplied into the vacuum container 43 from the gas feed unit 50, and a high frequency voltage is applied to the high frequency electrode 44 from the high frequency power supply 45. The argon gas in the vacuum container 43 forms argon ions in plasma state, and impinges on the top surface of the substrate 11 mounted on the high frequency electrode 44 as indicated by broken-line arrow in FIG. 5, thereby etching. In this way, the nickel compound 32 on the surface of the electrode 14 is removed. In this case, argon ions impinge not only on the surface of the electrode 14 but also on the surface of the substrate 11. As a result, the surface of the substrate 11 is roughened, and the surface roughness increases. The effect of surface roughness is described later.

Figure 6:
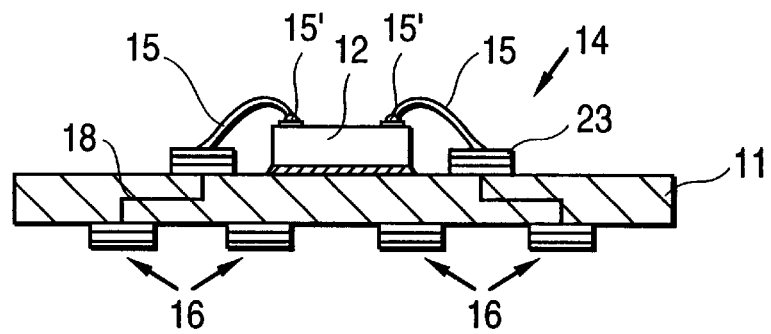
Figure 7:
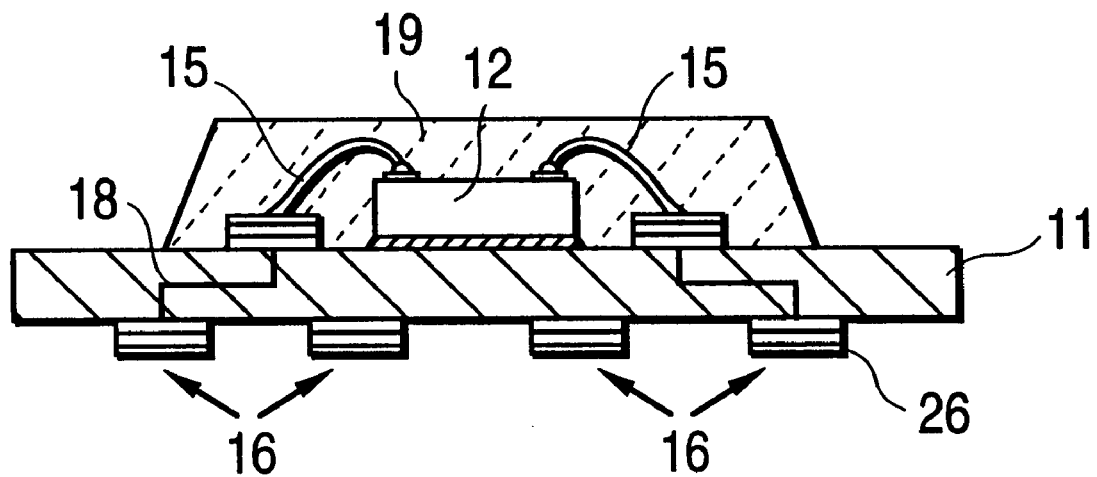

After removing the nickel compound 32 on the electrode 14 side in this way, as shown in FIG. 6, a gold wire 15 is bonded on a gold layer 23 of the top side electrode 14 by wiring bonding. Next, as shown in FIG. 7, the semiconductor element 12 and gold wire 15 are sealed by molded resin 19. In this case, as mentioned above, the surface of the substrate 11 is rough by plasma etching. This rough surface acts as anchor, and contributes to enhancement of adhesion between the substrate 11 and molded resin 19.

Figure 8:
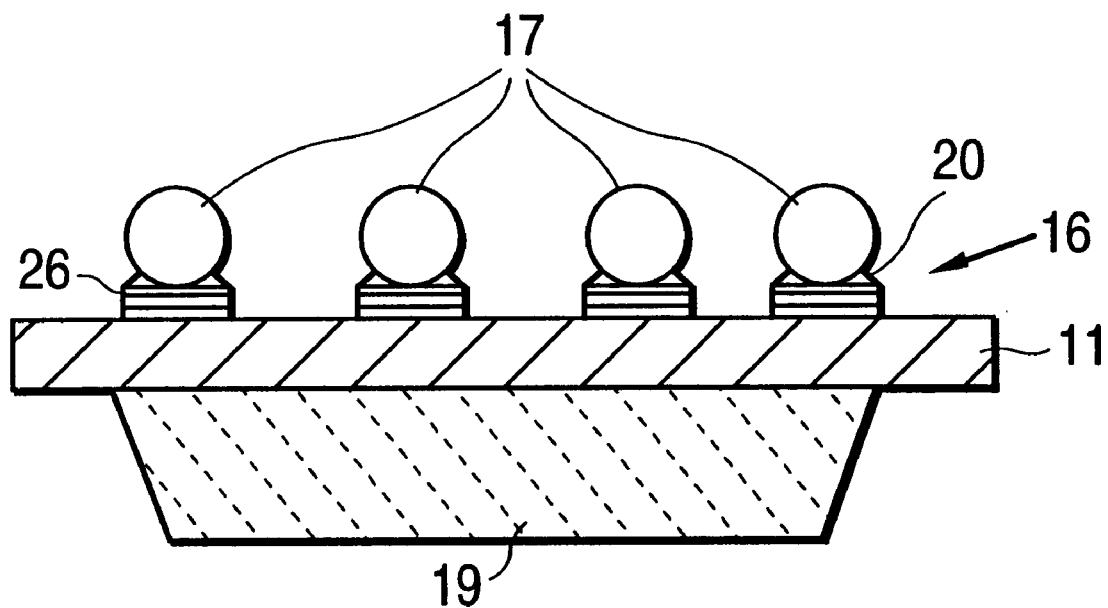
Figure 9:
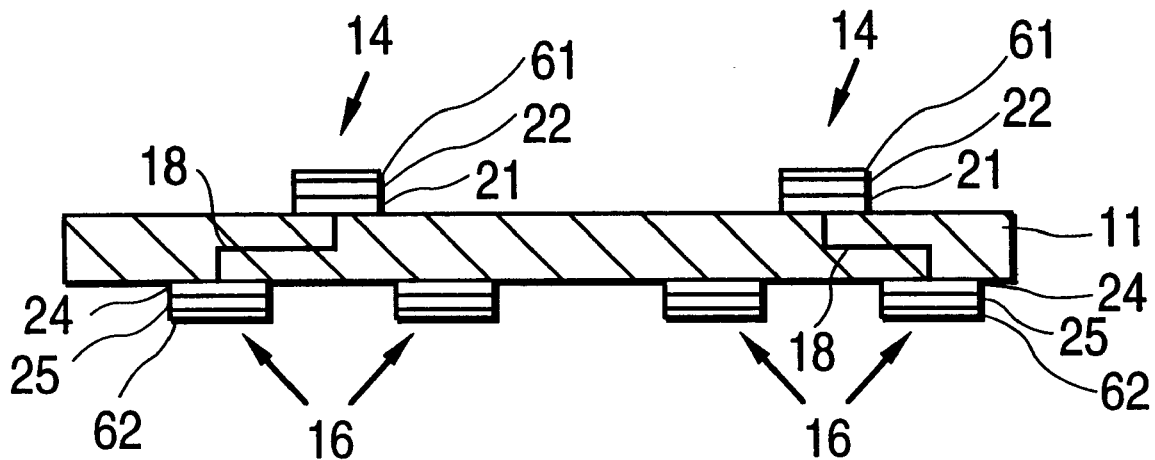
FIG. 9 through FIG. 15 are drawings for explaining a method of manufacturing an electronic component in a second embodiment, FIG. 9 being a sectional view of a substrate, FIG. 10 being a sectional view of the substrate on which a semiconductor element is fixed, FIG. 11 being a sectional view around the electrode after heat treatment, FIG. 12 being a sectional view after wire bonding, FIG. 13 being a sectional view after molding a resin, FIG. 14 being a sectional view of a plasma etching apparatus, and FIG. 15 being a sectional view after forming a solder bump.

Then, as shown in FIG. 8, the substrate 11 is turned upside down, and a solder ball 17 is mounted on the gold layer 26 of the electrode 16 side. At this time, flux 20 is applied between the solder ball 17 and gold layer 26. Afterwards, the substrate 11 is sent into a reflow process, the solder ball 17 is soldered to the electrode 16 side, and the solder ball 17 becomes a solder bump 17, thereby completing the electronic component 30 shown in FIG. 1. At this time, the nickel compound 33 formed on the gold layer 26 (see FIG. 4) is reduced by the flux 20 and is melted into the solder bump 17, and hence it has no effect on the bonding performance of the solder bump 17. The gold layer 26 is melted into the solder bump 17, but since the film thickness is very thin as stated above, only a very small amount is melted into the solder bump 17. Therefore, the bonding performance of the solder bump 17 is not impaired, and a highly reliable solder bump 17 is formed. Besides, since the gold layers 23, 26 are extremely thin, the consumption of the expensive material of gold can be substantially saved, and the manufacturing cost of the electronic component can be notably reduced, Second embodiment Referring now to FIG. 9 through FIG. 15, a method of manufacturing an electronic component in a second embodiment is described. The structure of the electronic component is same as shown in FIG. 1. FIG. 9 through FIG. 15 are shown in the sequence of manufacturing process. First, as shown in FIG. 9, an electrode 14 is formed on the top surface side of a substrate 11. The electrode 14 is formed by coating a copper pad 21, coating a nickel layer 22 as a barrier metal layer on the copper pad 21, and further coating a gold layer 61 on the nickel layer 22 in a sufficient thickness for metal bonding performance, that is, a sufficient thickness for not interfering bonding with metal (about 0.2 to 1.0 micron). The copper pad 21 is formed by adhering a copper foil to the surface of the substrate 11, and removing the unnecessary portion by etching. The nickel layer 22 and gold layer 61 are formed by plating. At the same time, an electrode 16 is also formed on the bottom surface side. The electrode 16 is formed by plating a nickel layer 25 on the copper pad 24, and further plating a gold layer 62 on the nickel layer 25. The nickel layers 22, 25 are formed simultaneously in a same plating process, and the gold layers 61, 62 are also formed simultaneously in a same plating process. For the plating process of the gold layers 61, 62, electrolytic plating is preferred because a sufficient thickness can be easily obtained.

Figure 10:
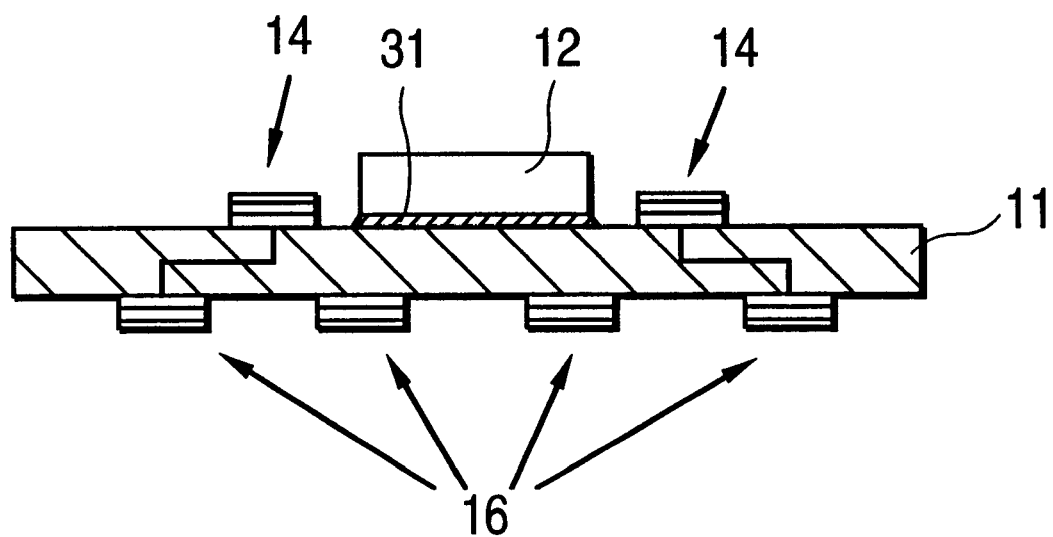
Figure 11:
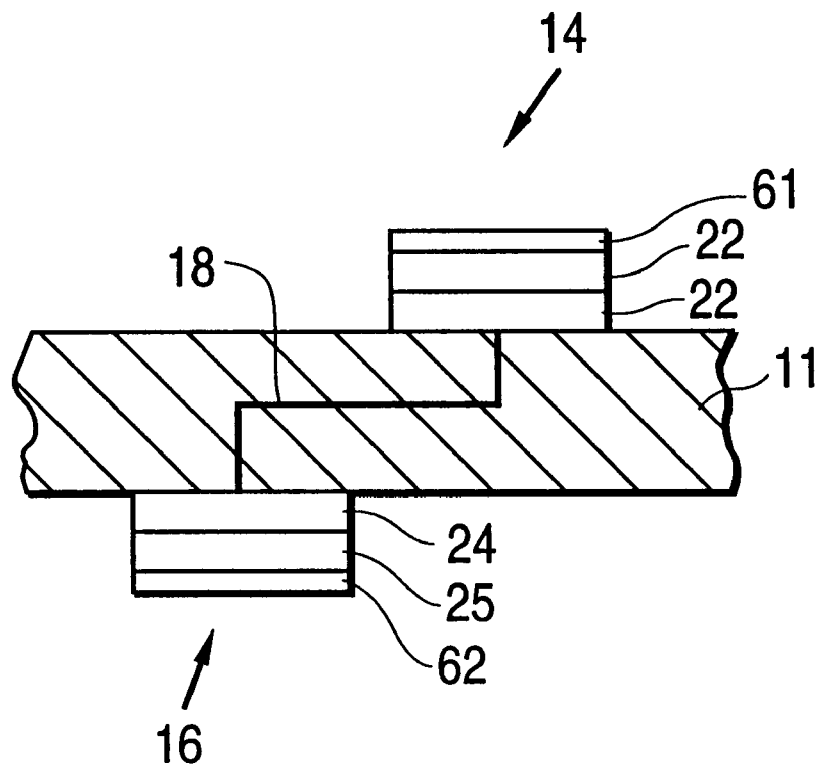

Consequently, as shown in FIG. 10, a semiconductor element 12 is mounted on the top surface of the substrate 11. The semiconductor element 12 is adhered by a thermosetting adhesive 31 preliminarily applied on the top surface of the substrate 11, and then the substrate 11 is heated. As the thermosetting adhesive 31 is cured, the semiconductor element 12 is fixed to the substrate 11. FIG. 11 is a sectional view around the electrodes 14, 16 of the substrate 11 after this heat treatment. Herein, since the gold layers 61, 62 have a sufficient thickness for metal bonding performance, nickel compound interfering bonding performance of gold wire is not formed on the surface of the gold layers 61, 62.

Figure 12:
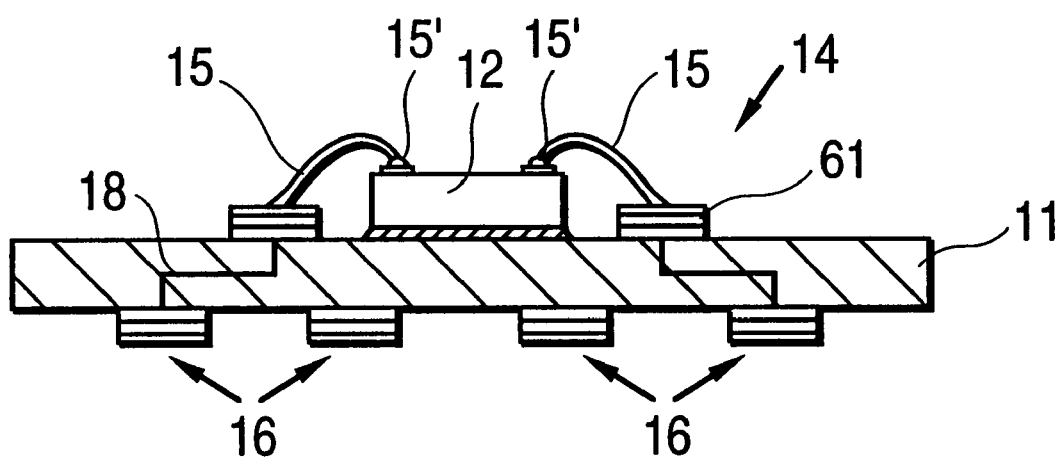
Figure 13:
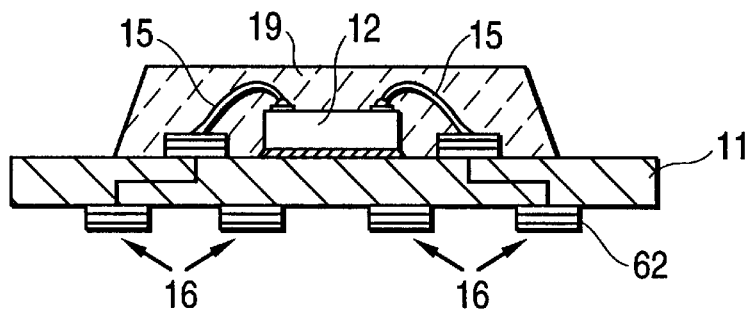

Next, as shown in FIG. 12, a gold wire 15 is bonded on the gold layer 61 of the top side electrode 14 by wire bonding. As a result, the semiconductor element 12 is connected to the gold layer 61. Therefore, the gold wire 15 works as connecting means between the semiconductor element 12 and gold layer 61. At this time, the surface of the gold layer 61 is almost free from nickel compound interfering the bonding performance of gold wire, and hence favorable bonding is realized. Later, as shown in FIG. 13, the semiconductor element 12 and gold wire 15 are sealed by a resin mold 19.

Figure 14:
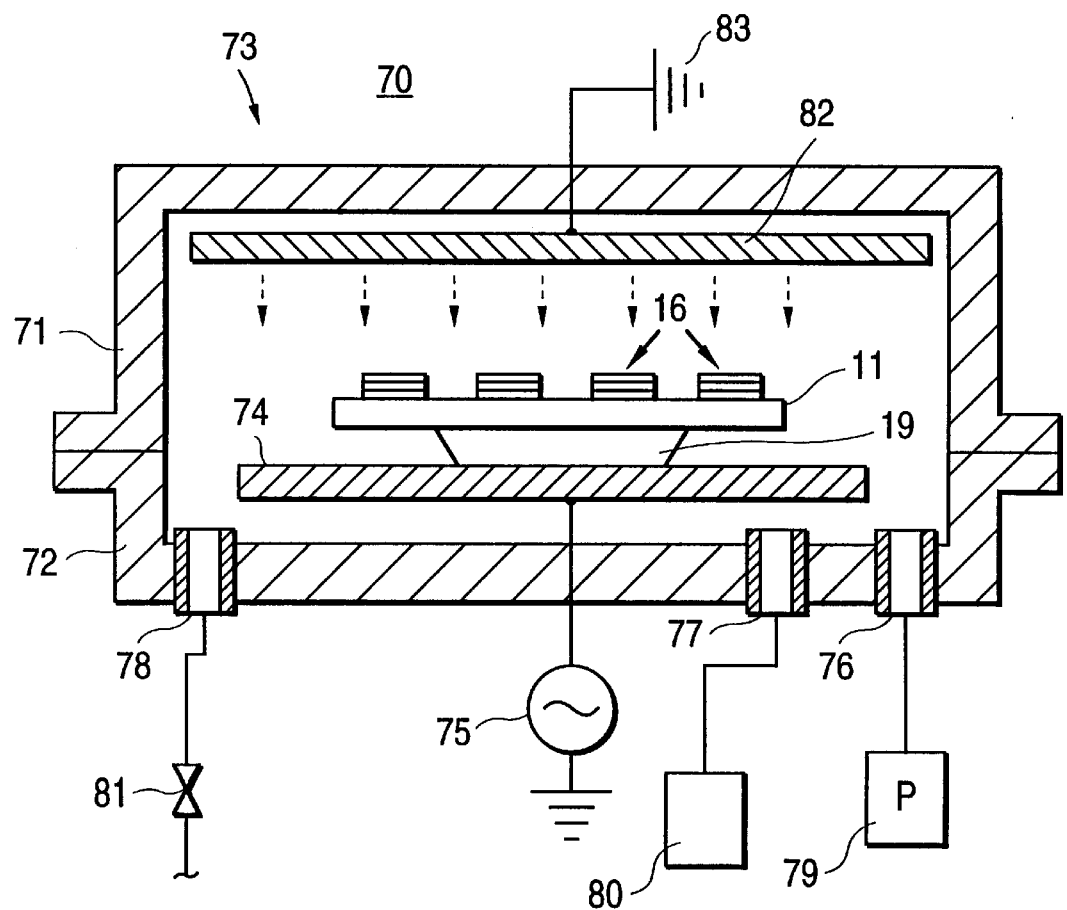

Plasma etching is then carried out to thin out the gold layer at the electrode 16 side. Referring to FIG. 14, the structure of a plasma etching apparatus 70 used in this plasma etching is described below. In FIG. 14, an upper casing 71, together with a lower casing 72, forms a vacuum container 73 which is free to open and close. A high frequency electrode 74 is disposed in the bottom of the lower casing 72. A high frequency power supply 75 is connected to the high frequency electrode 74. Pipes 76, 77, 78 are provided in the bottom of the lower casing 72. A vacuum source 79 is connected to the pipe 76. A gas feed unit 80 for feeding plasma etching gas such as argon gas is connected to the pipe 77. A vacuum breakage valve 81 is connected to the pipe 78.

An earth electrode 82 is mounted on the top of the upper casing 71. The earth electrode 82 is grounded to a grounding unit 83, and is installed opposite to the high frequency electrode 74. The substrate 11 is mounted on the high frequency electrode 74.

The operation of this plasma etching apparatus 70 is described below. As shown in FIG. 14, the substrate 11 is inverted to set the electrode 16 side upward, and is mounted on the high frequency electrode 74, and the upper casing 71 is closed. Then, the vacuum source 79 begins to evacuate, and the inside of the vacuum container 73 reaches a specified degree of vacuum. Consequently, argon gas is supplied into the vacuum container 73 from the gas feed unit 80, and a high frequency voltage is applied to the high frequency electrode 74 from the high frequency power supply 75. The argon gas in the vacuum container 73 forms argon ions in plasma state, and impinges on the top surface of the substrate 11 mounted on the high frequency electrode 74 as indicated by broken-line arrow in FIG. 14, thereby etching. In this way, the gold layer 62 on the surface of the electrode 16 is removed, and the gold layer 62 is thinned out to a thickness of about 0.01 to 0.2 micron (preferably 0.01 to 0.15 micron). However, the gold layer 62 is not removed completely in order to keep wettable between the molten solder and the electrode 16.

Figure 15:
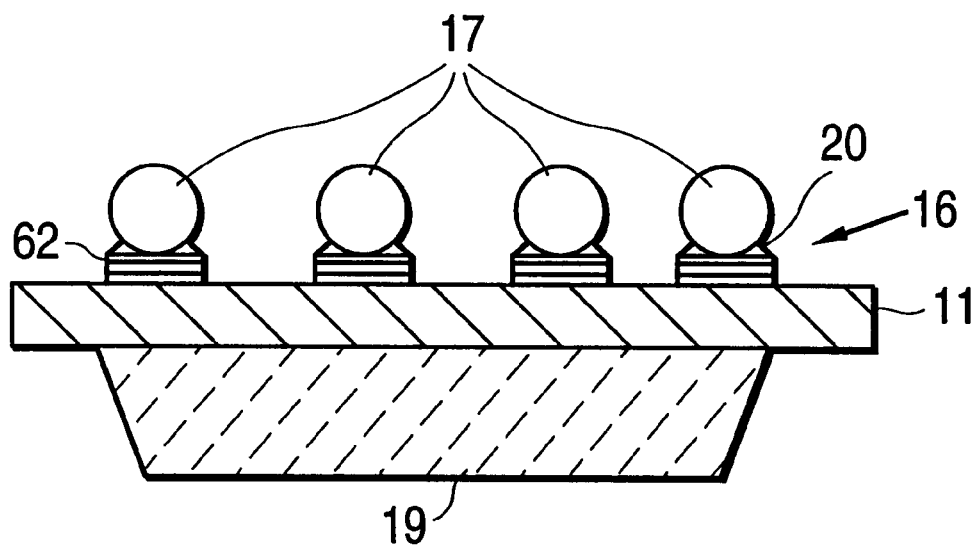
Figure 17:
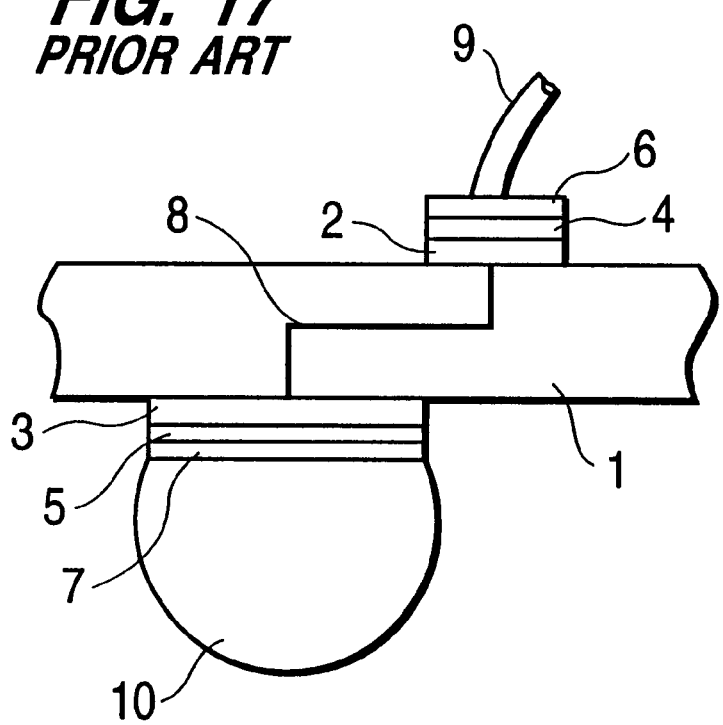
FIG. 17 is a sectional view around the electrode in a conventional electronic component.

Then, as shown in FIG. 15, a solder ball 17 is mounted on the gold layer 62 of the electrode 16 side. At this time, flux 20 is applied between the solder ball 17 and gold layer 62. Afterwards, the substrate 11 is sent into a reflow process, the solder ball 17 is soldered to the electrode 16 side, and the solder ball 17 becomes a solder bump 17, thereby completing the electronic component shown in FIG. 1. At this time, the gold layer 62 is melted into the solder bump 17, but since the gold layer 62 is very thin by plasma etching, only a very small amount of gold is melted into the solder bump 17. Therefore, the compound of gold and tin that impairs the bonding performance of the solder bump 17 is formed very slightly, so that a highly reliable solder bump 17 may be formed. Besides, since the surface of the gold layer 62 is processed by etching, nickel and contaminant interfering the solder wettability are cleanly removed. Hence, the solder can be bonded to the electrode with enough wettability.

The invention is not limited to the above embodiments alone. In the embodiment, the semiconductor element is connected to the gold layer 61 of the electrode 14 by wire bonding, but the connecting method is not limited to this alone, and ribbon bonding, tab bonding, flip semiconductor element bonding and other methods may be also preferred.

Figure 16A:
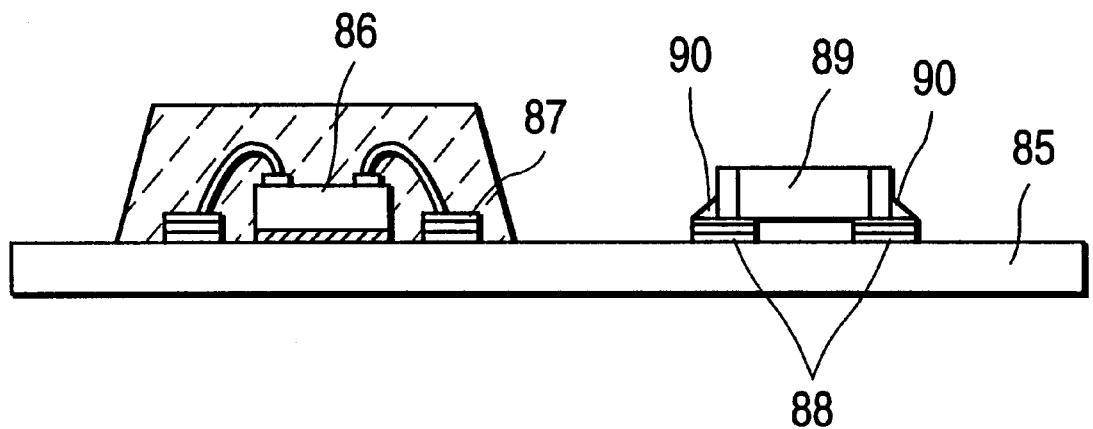
FIG. 16(*a*) and FIG. 16(*b*) are drawings showing the structure of an electronic component in other embodiments.
Figure 16B:
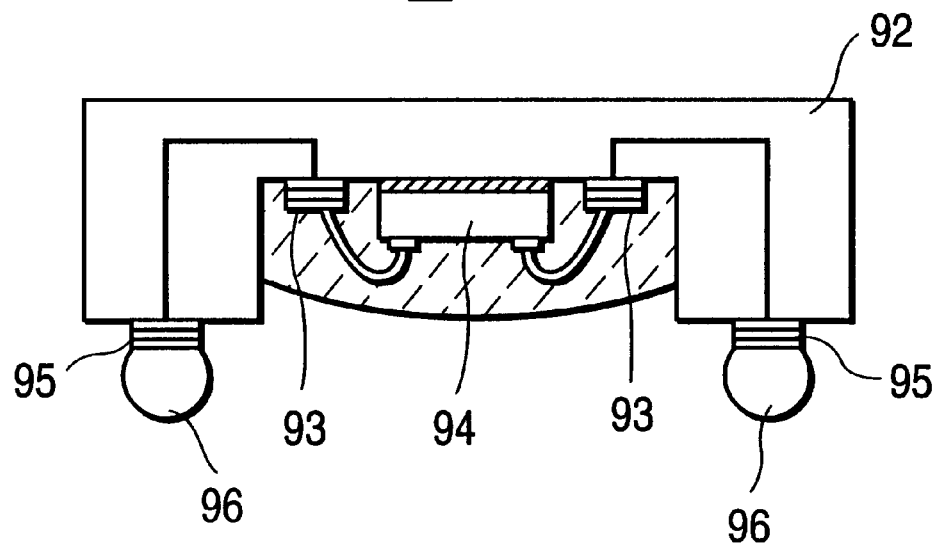

In the illustrated embodiments, the semiconductor element is mounted at one side of the substrate, and the solder bump is formed at the other side, but the invention may be applied as far as the bonding and soldering are mixed within the same substrate. FIG. 16(a) shows an electronic component 84 in a different embodiment. In this electronic component 84, a semiconductor element 86 mounted on a substrate 85 and an electrode 87 on the substrate are connected by wire bonding, and sealed with resin, and an electronic part element 89 is electrically connected on an electrode 88 through a solder portion 90. Gold films are formed on the electrodes 87, 88, and when this invention is applied, wire boding is performed favorably, brittleness of the solder portion 90 may be kept to a minimum limit. Moreover, as shown in FIG. 16(b), the invention maybe also applied to an electronic component 91 formed by connecting a semiconductor element 94 to an electrode 93 on a substrate 92 by wire bonding, and forming a solder bump 96 on a gold layer on an electrode 95 formed on the same surface.

According to the invention, after forming a gold layer of enough thickness for metal bonding performance on an electrode on a substrate, the gold layer interfering the bonding performance of solder is removed and thinned by plasma etching, and then solder bump or the like is soldered, and therefore, in connection between gold layer and semiconductor element by wiring bonding or the like, favorable bonding is realized, being free from formation of nickel compound which interferes bonding, and soldering is also done favorably because brittle compound of tin and gold is not formed, so that a highly reliable electronic component may be obtained.

What is claimed is:

1. A method of manufacturing an electronic component comprising the steps of:

forming plural copper pads as electrodes on a first surface and a second surface of a substrate;

forming a barrier metal layer comprising a nickel layer, on a surface of each of the plural copper pads;

forming a gold layer by plating on a surface of the barrier metal layer;

removing a nickel compound formed on a surface of the gold layer from electrodes disposed on said first surface of said substrate by plasma etching;

connecting a semiconductor element and the gold layer electrically;

forming a resin for sealing the semiconductor element on said first surface of the substrate; and forming a solder portion on the gold layer of electrodes disposed in said second surface of said substrate.

2. A method of manufacturing an electronic component of claim 1, wherein the solder portion is a solder bump.

3. A method of manufacturing an electronic component of claim 1, wherein the solder portion is electrically connected with an electronic part.

4. A method of manufacturing an electronic component of claim 1, wherein a thickness of the gold layer formed by plating is 0.03 micron to 0.05 micron.

5. A method of manufacturing an electronic component comprising the steps of:

forming a copper pad as an electrode at each of plural positions on a surface of a substrate;

forming a barrier metal layer comprising a nickel layer, on a surface of the copper pad;

forming a gold layer of enough thickness for metal bonding performance on a surface of the barrier metal layer by plating;

connecting a semiconductor element and the gold layer electrically;

sealing the semiconductor element with resin; thinning the gold layer not sealed with the resin by plasma etching; and forming a solder portion on the thinned gold layer.

6. A method of manufacturing an electronic component of claim 5, wherein the solder portion is a solder bump.

7. A method of manufacturing an electronic component of claim 5, wherein the solder portion is electrically connected with an electronic part.

8. A method of manufacturing an electronic component of claim 5, wherein a thickness of the gold layer formed by plating is 0.2 micron to 1.0 micron.

9. A method of manufacturing an electronic component of claim 5, wherein the step of connecting the semiconductor layer and the gold layer electrically is wire bonding.

10. A method of manufacturing an electronic component of claim 5, wherein the step of connecting the semiconductor layer and the gold layer electrically is flip chip bonding.

11. A method of manufacturing an electronic component of claim 5, wherein the step of connecting the semiconductor layer and the gold layer electrically is ribbon bonding.

12. A method of manufacturing an electronic component of claim 5, wherein a thickness of the gold layer is reduced to 0.01 micron to 0.2 micron by plasma etching.

13. A method of manufacturing an electronic component comprising the steps of:

forming plural copper pads as electrodes on a surface of a substrate;

forming a barrier metal layer comprising a nickel layer, on a surface of each of the plural copper pads;

forming a gold layer on a surface of the barrier metal layer by plating, the gold layer having a thickness of 0.03 to 0.05 microns;

removing a nickel compound formed on a surface of the gold layer by plasma etching;

connecting a semiconductor element and the gold layer of at least one of the plural copper pads electrically;

forming a resin for sealing the semiconductor element on the surface of the substrate; and forming a solder portion on the gold layer of at least one of the plural copper pads.

14. A method of manufacturing an electronic component comprising the steps of:

forming a copper pad as an electrode at each of plural positions on a surface of a substrate;

forming a barrier metal layer comprising a nickel layer, on a surface of the copper pad;

forming a gold layer on a surface of the barrier metal layer by plating, the gold layer having a thickness of 0.2 to 1.0 micron;

connecting a semiconductor element and the gold layer of at least one of the plural positions electrically;

sealing the semiconductor element with a resin;

thinning the gold layer of at least one of the plural positions to a thickness of 0.01 to 0.2 microns by plasma etching; and forming a solder portion on the thinned gold layer.

* * * * *